United States Patent [19]

Cerney

[11] Patent Number: 5,223,041
[45] Date of Patent: Jun. 29, 1993

[54] APPARATUS AND PROCESS FOR PROCESSING PRINTING PLATES

[76] Inventor: Donald E. Cerney, 321 E. Orange St., Vista, Calif. 92084

[21] Appl. No.: 783,267

[22] Filed: Oct. 28, 1991

Related U.S. Application Data

[63] Continuation of Ser. No. 200,678, May 31, 1988, abandoned.

[51] Int. Cl.⁵ ............................................. B08B 1/02
[52] U.S. Cl. ................................. 134/15; 134/25.4; 134/30
[58] Field of Search .............. 134/65, 72, 172, 180, 134/181, 64 R, 180, 199, 122 R, 15, 25.4, 30

[56] References Cited

U.S. PATENT DOCUMENTS

| | | | |
|---|---|---|---|
| 760,276 | 5/1904 | Thorpe | 415/75 |
| 779,483 | 1/1905 | MacIlwaine | 134/144 |
| 1,604,405 | 10/1926 | Fox | 134/102 |
| 2,970,541 | 2/1961 | Gegenheimer | 101/425 |
| 3,656,493 | 4/1972 | Black et al. | 134/113 |
| 3,760,824 | 9/1973 | Edwards et al. | . |
| 3,769,992 | 11/1973 | Wallestad | 134/144 |
| 3,780,747 | 12/1973 | Stadie et al. | 134/172 |
| 3,896,730 | 7/1975 | Garrett et al. | 101/425 |
| 3,913,797 | 10/1975 | Brym | 222/253 |
| 4,076,033 | 2/1978 | Busse et al. | . |
| 4,129,137 | 12/1978 | Kurita et al. | 134/144 |
| 4,393,778 | 7/1983 | Kaneko | 101/425 |
| 4,448,221 | 5/1984 | Murray | 134/172 |
| 4,788,992 | 12/1988 | Swainbank et al. | . |

Primary Examiner—Asok Pal
Attorney, Agent, or Firm—Lyon & Lyon

[57] ABSTRACT

Previously patterned printing plates are washed under a high pressure spray of water that removes unreacted photopolymer or emulsion. The water is sprayed at a pressure of about 500 to about 1000 pounds per square inch, preferably about 800 pounds per square inch. An apparatus for processing plates moves the plates past spray nozzles. The nozzles are supported on a carriage that reciprocates transversely to the direction of movement of the plates, so that the entire surface of each plate is subjected to the direct water spray. The plates are dried under an infrared heater and post cured by ultraviolet light after being washed.

5 Claims, 3 Drawing Sheets

APPARATUS AND PROCESS FOR PROCESSING PRINTING PLATES

This is a continuation of co-pending application Ser. No. 07/200,678, filed on May 31, 1988 and which designated the U.S., now abandoned.

BACKGROUND OF THE INVENTION

This invention relates to the processing of coated printing plates, and, more particularly, to the washing of the plates after exposure.

In the mass-production printing of newspapers and magazines, the text and pictures are first reproduced as a pattern on a printing plate. Ink is applied to the printing plate and transferred to a piece of paper. One printing plate is used to make thousands of images on paper, by continually reinking the plate.

Many newspapers use the relief method of printing. The most widely practiced approach to relief printing uses photopolymer printing plates, which are typically thin steel or aluminum plates having a thick coating of a photosensitive polymer on one side. To reproduce a composed page of text and pictures in a form suitable for printing, a photographic negative of the page is prepared. The negative is placed on the coated side of the printing plate, and light is shone through the negative to strike the photosensitive material. Where there are transparent areas of the negative, the photosensitive material is exposed. Where there are opaque areas of the negative, the photosensitive material is not exposed. The light must be of a type that causes the photopolymer to react where exposed, and ultraviolet light is ordinarily used for this purpose.

The exposure to ultraviolet light causes the photopolymer material to polymerize, so that the exposed areas become polymerized and the unexposed areas remain unpolymerized. The unpolymerized areas of photopolymer are washed away with water or solvent, and the plates are dried. The polymerized areas of photopolymer, not removed in the wash, are post-cured with ultraviolet light. The resulting plate has raised or relief areas which pick up ink and transmit it to the paper for printing. The plate is then ready for mounting in the press.

The present invention deals with the processing steps in which the unreacted photopolymer is washed away, the plates are dried, and the remaining photopolymer is post-cured. These three steps are usually performed in a single piece of machinery, termed a "plate processor". Existing types of plate processors have a washing section, a drying section, and a post-curing section, and the plates are moved sequentially through these sections either automatically or semi-automatically.

The plate processor should remove the unexposed (or weakly exposed), soft photopolymer material, even from small recesses on the coated side of the plate. If the soft polymer material remains on the surface, ink can accumulate to cause a progressive deterioration in the quality of the printed pages. The later-printed pages may have blurred regions where ink has unintentionally accumulated as a result of incomplete washing. The plate processor should also permit a high throughput of plates, as a reduction in the processing time results in later final news deadlines and better service to the reader of the newspaper. The plate processor should be convenient to use, and as inexpensive as possible in both investment cost and operating cost.

Several different types of plate processors are available, differing primarily in the manner in which the plate is washed (rather than the manner of drying or post-curing). In one approach, the plate is moved through a washing region while the sprays from a large number of low-pressure spray nozzles are directed against the plate. The quality of the finished plates is good, but a large amount of surface foam is generated that is difficult to suppress. This machine can have a high throughput of plates, but is expensive to operate.

Another plate processor uses reciprocating brushes to scrub away the unreacted photopolymer while the plates are passed through a shallow water bath. Most of the unreacted photopolymer material is removed, but the bristles may not be able to reach into small recesses, which may be smaller than the diameter of a single bristle. Unreacted photopolymer material may consequently be left on the surface of the printing plate, particularly in the small recesses of raised areas. The result is a buildup of ink between these raised areas during printing, and a progressive deterioration in print quality. The scrubbing action also can have the unfortunate side effect of damaging some of the polymerized areas, which desirably should not be affected by the washing, by rubbing away some of the polymerized material.

The existing plate processors therefore produce plates that may have unremoved photopolymer or damage to the relief areas, both of which reduce print quality. In addition, they are large in size, using valuable floor space, and are costly to purchase and to operate.

There therefore exists a need for an improved plate washer that produces high quality plates, is compact, and is inexpensive to purchase and to operate. The present invention fulfills this need, and further provides related advantages.

SUMMARY OF THE INVENTION

The present invention provides a plate processing apparatus and a process for washing coated plates. Unreacted and unpolymerized coating material is efficiently removed, without damaging the polymerized material. Print quality of plates processed with this approach is better than that of prior processors, particularly during extended printing runs. The apparatus has an acceptable plate throughput, yet is only about one-half the size of prior plate processors. It is less expensive to purchase and to operate, due to its smaller size, lower consumption of water, and lower maintenance costs.

In accordance with the present invention, apparatus for processing a plate having a photosensitive polymer coating on one side thereof, the coating having been previously patterned by exposure to light, comprises means for conveying the polymer coated plate through the apparatus; a water spray nozzle; a nozzle carriage that movably supports the nozzle above the means for conveying with the nozzle pointed so as to spray water against the coated side of the plate supported on the means for conveying; means for reciprocatingly moving the nozzle carriage transversely to the direction of motion of the plate as it moves through the apparatus on the means for conveying; and a pump system that delivers water to the water spray nozzle under a pressure of from about 500 to about 1000 pounds per square inch. The plate processor also desirably includes drying means with infrared heaters positioned so that the washed plates move through the drying section, and further desirably includes post-curing means with an ultraviolet lamp positioned so that the plates move through the post-curing section.

More generally, apparatus for processing plates having a coating on one side thereof comprises means for directing a spray of water pressurized to a pressure of from about 500 to about 1000 pounds per square inch against the coated side of the plate. The apparatus preferably includes means for moving the plate relative to the spray so that all portions of the coated side of the plate are contacted by the direct spray.

In a related processing approach, a process for processing a coated plate comprises the steps of furnishing a printing plate having a coating on one side thereof, the plate having been previously exposed to produce a pattern in the coating; and directing a spray of water at the coated side of the plate under a pressure of from about 500 to about 1000 pounds per square inch.

Unpolymerized photopolymer material is removed from the surface of the plate with a high pressure water spray, operating at from about 500 to about 1000 pounds per square inch (psi), preferably about 800 psi. By contrast, in prior plate washers the spray pressure was only about 50-100 psi. The preferred spray pressure of the present invention, 800 psi, is on the order of 10 times that used in available plate processors.

The high spray pressure completely removes the unpolymerized photopolymer material even in recesses that cannot be cleaned by low pressure sprays or by brushes. The plates processed by this approach therefore can print more pages before the recesses become clogged so as to cause smeared printing.

The plate processor of the present invention requires only a small number of high pressure nozzles, typically only four nozzles, rather than a much larger number of low pressure nozzles, typically about 300 nozzles in existing plate processors. The water consumption of the present approach is much smaller due to the smaller number of nozzles required, even though the pressure is higher. Because the water consumption is lower, it is feasible to dispose of the water rather than recirculate it, reducing the likelihood of contamination of the plates by photopolymer material washed from prior plates. The foam problem experienced with the low pressure plate processor sprays is eliminated with the high pressure spray approach, because the water is not recirculated.

The smaller number of nozzles also reduces the maintenance requirements for the plate processor using high pressure sprays, because fewer nozzles are present and also because they are less likely to become clogged with foreign matter, since the spray water is not recirculated. The spray nozzles used in the high pressure plate processor are preferably lined with tungsten carbide to resist erosion, but such nozzles are readily available. The power consumption of the present invention is also lower than that of prior plate washers. The prior 300-nozzle plate processor requires a 25 horsepower pump, while the present high pressure, low volume sprayer requires only a 1 horsepower pump. The high pressure plate processor of the invention requires about ¼ the floor space, utilizes about 1/7 the energy, and costs about ½ as much to purchase as the prior plate processors.

Other features and advantages of the present invention will be apparent from the following more detailed description, taken in conjunction with the accompanying drawings, which illustrate, by way of examples, the principles of the invention.

BRIEF DESCRIPTION OF THE DRAWINGS

FIG. 4 is a series of side elevational views of coated printing plates wherein

DETAILED DESCRIPTION OF THE PREFERRED EMBODIMENT

Figure 1:
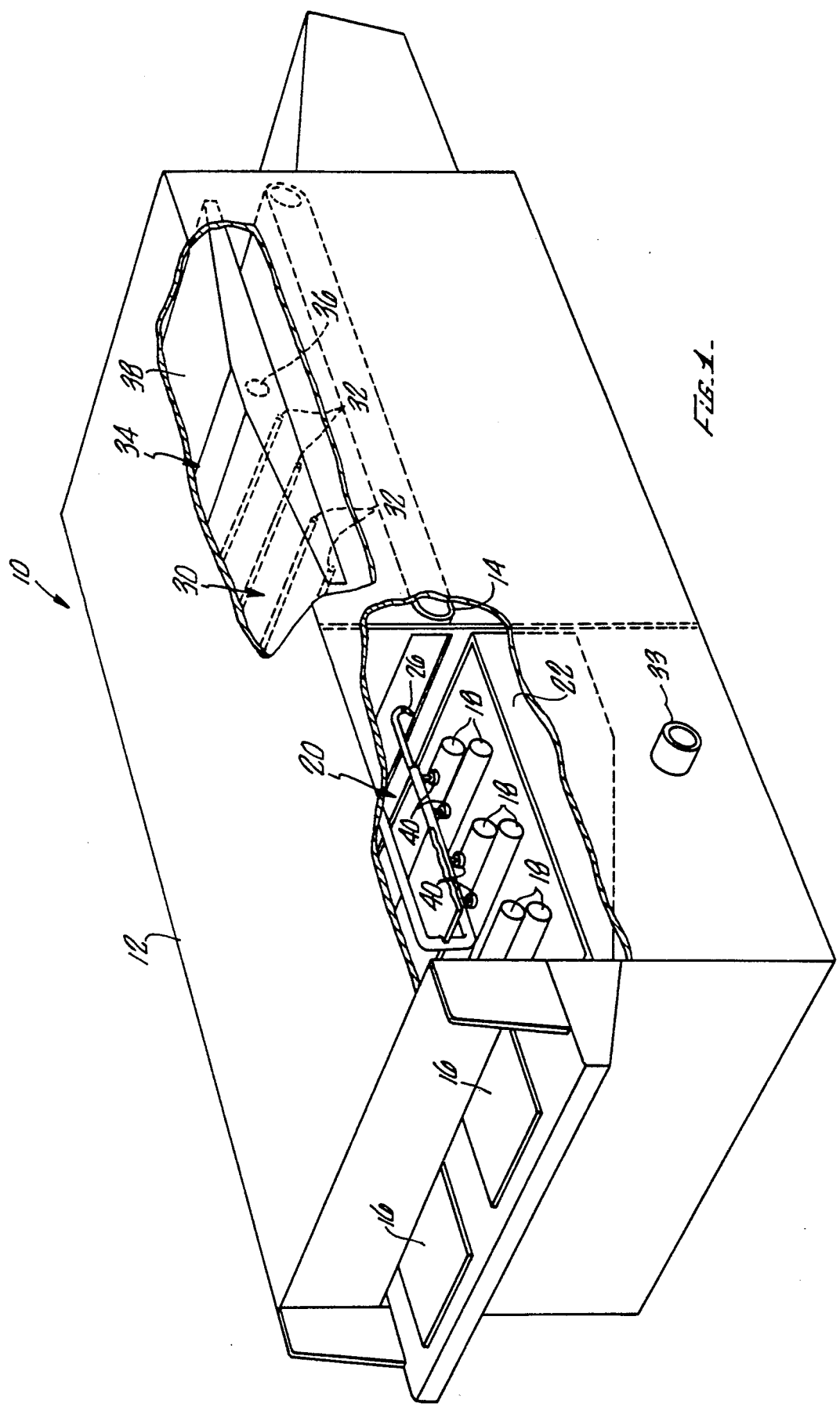
FIG. 1 is a perspective view of the plate processor of the invention, with portions of the housing cut away for clarity.

The present invention is embodied in a plate processor 10 illustrated in FIG. 1. The plate processor 10 includes a sheet metal enclosure 12, with a conveyer belt 14 and pairs of opposed rollers 18 that continuously move plates 16 into and through the enclosure 12, thence passing through the various areas where washing, drying, and post curing are performed. The sets of opposed rollers 18 move the plates 16 through the washing and air knife drying areas, and deliver the plates 16 to the conveyor belt 14, which moves the plates 16 through the drying and post curing areas. The conveyor belt 14 is an endless belt supported on a series of rollers. The enclosure 12, conveyor belt 14, and opposed rollers 18 are preferably dimensioned to be sufficiently wide that two plates 16 may be placed side by side therein.

The plates 16, grasped between the pairs of rollers 18, first pass through a washing station 20. At this station, the unpolymerized photopolymer on the coated side of the plates 16 is washed away with high pressure water sprays. The water is drained away immediately to a runoff collector 22, so that there is no accumulation or pool of water overlying the plates 16. An accumulation of water on the plates would diminish the effectiveness of the high pressure spray, and would be more difficult to remove when the plates are to be dried.

The plates 16 continuously move forward under the water sprays. After leaving the washing station, the plates 16 pass under a scanning air knife station 24, where excess water is blown from the surface of the plates 16 by a high pressure air spray. The air spray is produced by an air spray nozzle 26 that is supplied with filtered air from an air line 28, at a pressure of about 80 psi. Tandem air spray nozzles may also be used. The nozzle 26 and manifold 28 are supported above the rollers 18, so that the air spray is directed downward toward the surface of the plates 16. The air spray from the nozzle 26 blows excess water from the surface of the plates 16, reducing the subsequent drying requirements. Water so removed falls to the runoff collector 22.

The water spray nozzles and air knife nozzle are reciprocated back and forth over the width of the plates with a traversing mechanism to ensure full coverage. The traversing mechanism is illustrated more fully in FIGS. 2 and 3, and will be described in more detail subsequently.

Leaving the air knife station 24, the plates 16 (now supported on the conveyor belt 14) pass into a drying station 30, wherein the plates 16 are heated by infrared heaters 32. The infrared heaters 32 are positioned above the conveyor belt 14, so that heat from the heaters 32 is directed downwardly onto the surface of the plates 16 and the belt 14. The drying station 30 is fully enclosed by the enclosure 12, to maximize the drying effects of the heaters 32. The heating of the plates 16 causes the remaining water on the plates 16 and conveyor belt 14 to evaporate into the atmosphere, leaving them warm and dry as they leave the drying station 30. In the preferred approach, an infrared heater delivering about 7.5 watts per square inch is utilized.

Preferably, a duct 33 is provided so that water vapor produced by the washing station 20, air knife station 24, and drying station 30 can be evacuated by an external pump or fan (not shown) and removed, so that the water vapor does not escape into the room where the processor 10 is located.

The plates 16 are exposed to ultraviolet radiation from an ultraviolet lamp during and after heating by the infrared heaters 32, in a post-curing station 34. The ultraviolet lamp 36 is suspended over the conveyor belt 14 below a reflector 38, so that its radiation is directed downward onto the upper surface of the belt 14. The primary radiation output of the lamp is selected to be about 360 nanometers, a wavelength that is not visible to the human eye but is highly effective in causing the final and complete curing and polymerizing of the photosensitive polymer coated onto the upwardly facing surface of the plates 16. In a preferred approach, a single ultraviolet lamp of about 1500 watts is used.

The plates 16 emerging from the post curing station 34 are finished and ready for installation into a printing press (not shown).

Figure 2:
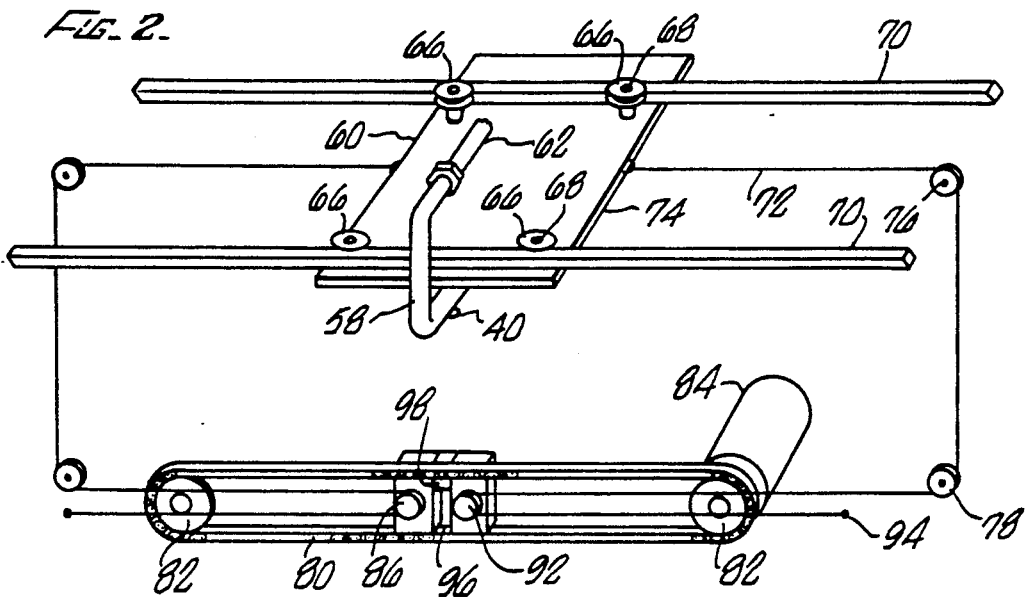
FIG. 2 is a perspective view of the high pressure spray nozzle, nozzle carriage, and traversing mechanism.
Figure 3:
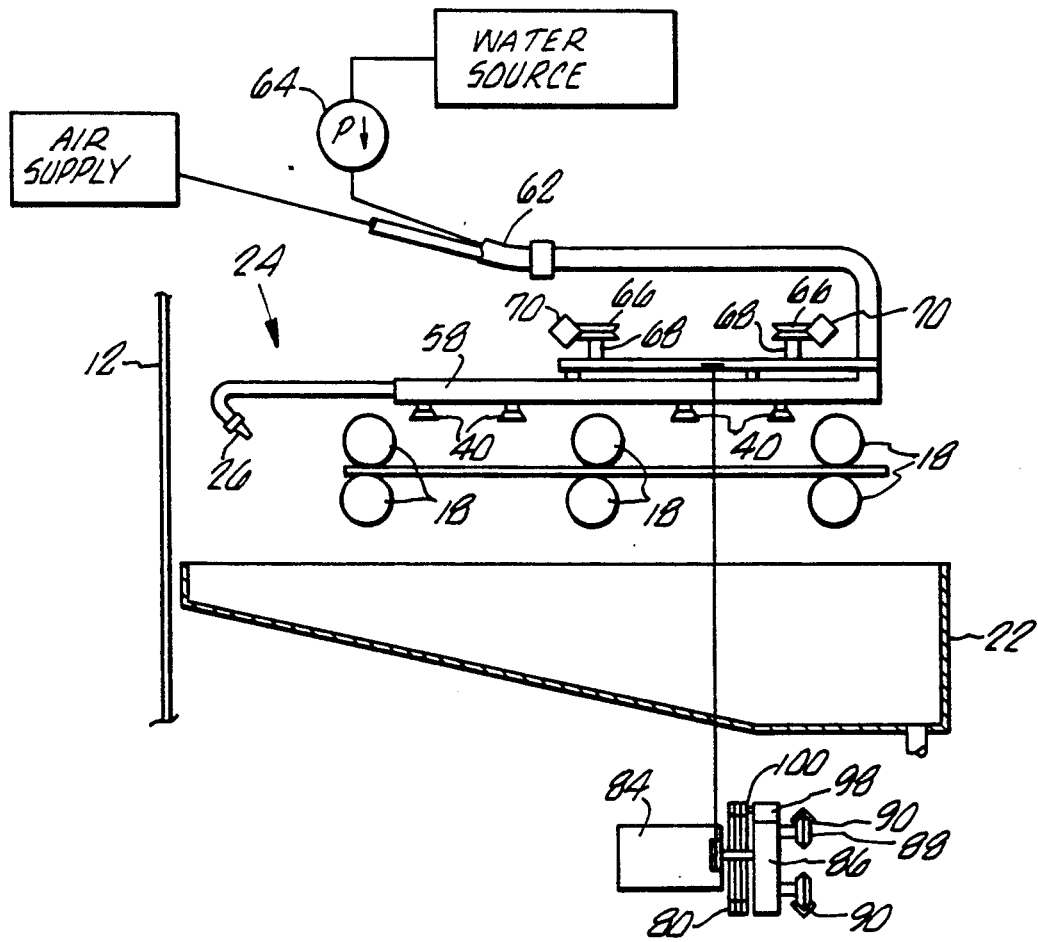
FIG. 3 is a side elevational view of the high pressure spray nozzle, nozzle carriage, and traversing mechanism.

The washing station 20 is illustrated in greater detail in FIGS. 2 and 3. To remove unpolymerized photopolymer material from the plate 16, a spray of water under a pressure of from about 500 psi to about 1000 psi is directed downwardly onto the upwardly facing surface of the plate 16 from a plurality, preferably four, of tandem water spray nozzles 40. The preferred water spray pressure is about 800 psi. Where the pressure is less than about 500 psi, removal of unpolymerized photopolymer is inefficient, so that the throughput of plates must be reduced. Where the pressure is greater than about 1000 psi, the partially polymerized photopolymer material, which is not to be removed, is damaged and sometimes removed by the high pressure water. The preferred pressure of about 800 psi achieves efficient removal of the unpolymerized photopolymer and avoids damage to the partially polymerized photopolymer material.

FIG. 4 illustrates the detailed structure of a printing plate 16, and the results of proper and improper washing. FIG. 4A shows a plate 16 prior to exposure, with a thick layer 42 of photosensitive polymer or photopolymer material coated onto one side of a steel or aluminum substrate 44. In FIG. 4B, a negative 46 is placed on the plate 16, and light is shone downwardly through the negative 46. Where the density of the negative is low, as at locations 48, light shows through the negative and exposes the photopolymer 42, causing the photopolymer to chemically change and become polymerized. Where the density of the negative is high, little light passes through the negative 48, and the photopolymer in the layer 42 remains unpolymerized. This process is termed patterning, and the plate is said to be patterned with the desired image. The polymerized regions in FIG. 4B are termed dots 50, as in the finished plate they protrude upwardly from the surface of the substrate 44, see FIG. 4C. The dots 50 have a desirably outwardly sloping profile that strengthens them, as the illumination of the negative 46 is normally not perfectly aligned. The dots 50 in FIG. 4B are illustrated to be close together, as this configuration reflects the high resolution condition of a good quality finished plate 16. A recess 54 between the dots 50 may be as small as 0.002 inches.

Figure 4A:
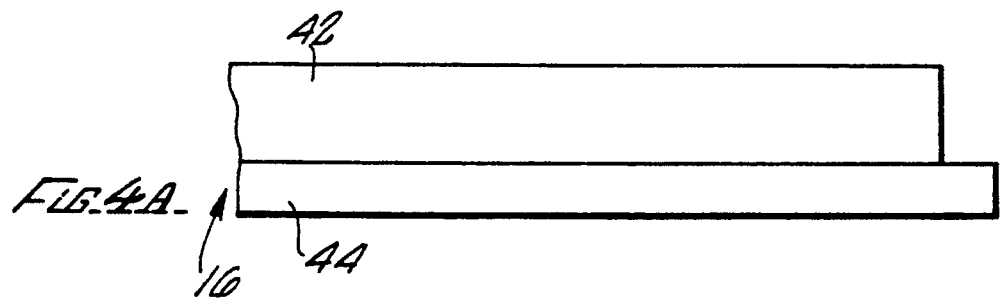
FIG. 4A is a coated plate prior to exposure.
Figure 4B:
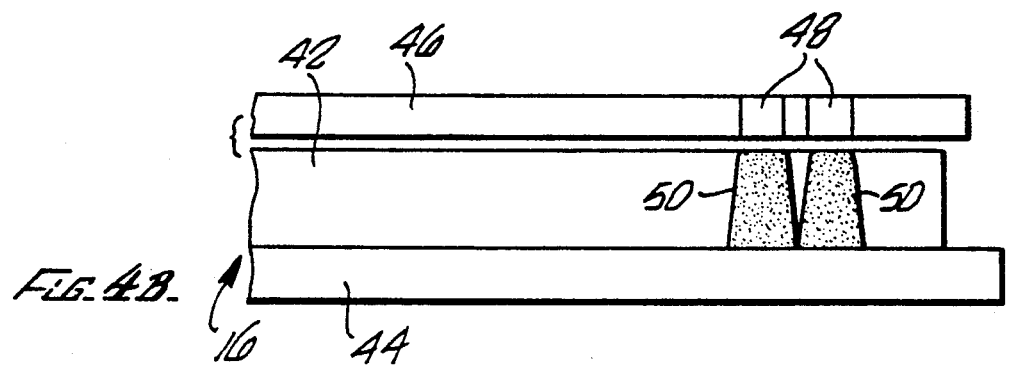
FIG. 4B is a plate during exposure.
Figure 4C:
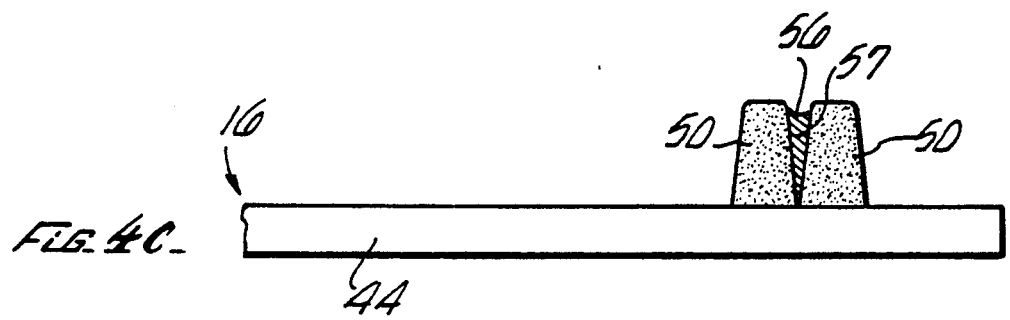
FIG. 4C is an ineffectively washed plate.

After the plate 16 is exposed, the unpolymerized (unexposed) photopolymer in the layer 42 must be removed by washing. FIG. 4C illustrates the results of an ineffective washing. The unpolymerized photopolymer is removed from much of the layer 42, but there is some residual photopolymer 52 remaining between the dots 50. This residual photopolymer 52 permits ink to collect in a basin 56 during printing operations, so that there is no longer a clear resolution of the adjacent dots 50.

The ineffective washing of FIG. 4C is observed in prior brush-type plate processors. Each bristle is about the same size as the narrowest of the recesses 54, and therefore cannot penetrate into the recesses 54, leaving residual photopolymer 52. It is also observed in plates processed with prior low pressure plate processors.

Figure 4D:
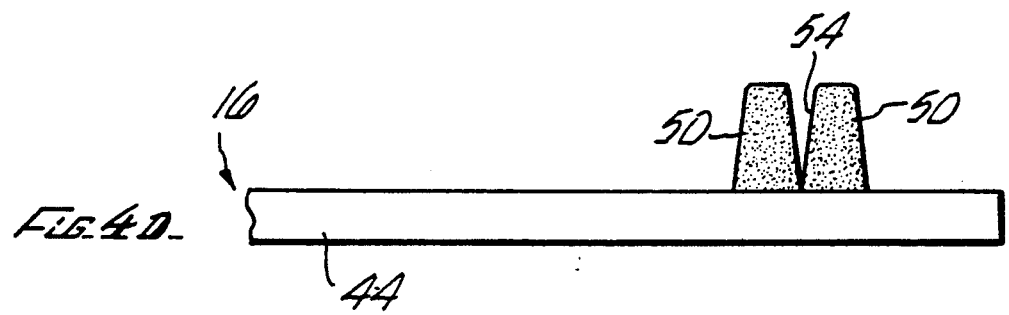
FIG. 4D is an effectively washed plate.
Figure 4E:
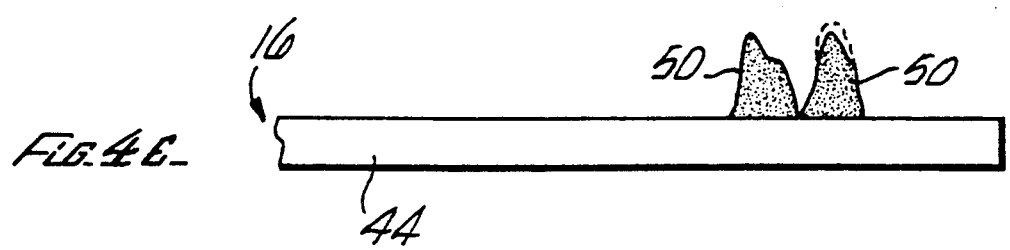
FIG. 4E is a plate washed with too high a water pressure.

As illustrated in FIG. 4D, it has been found that the high pressure spray of the present invention penetrates deeply into the recess 54 to remove virtually all of the unpolymerized photopolymer. No residual photopolymer remains, as illustrated in FIG. 4D. As a result, the finished plate 16 has a longer printing life before the recess 54 fills with foreign matter such as fibers from the printing paper. The printing press can therefore be operated for a longer press run before a shutdown to clean the plate 16 is required.

Where the water spray pressure is too low, below about 500 psi, the spray must be directed into the depth of the recess 54 for much longer periods of time before removal of the residual photopolymer can be completed. Consequently, the rate of movement of the plates 16 through the processor must be slowed to an uneconomical level. If, on the other hand, the plates are moved through the processor rapidly but with a low pressure wash spray, the final plate profile begins to resemble that illustrated in FIG. 4C.

Where the water spray pressure is too high, above about 1000 psi, the force of the spray is so great that portions of the partially polymerized photopolymer are eroded away, as illustrated in FIG. 4E. The dots 50 are damaged, with their profile altered from the desirable regular shape of FIG. 4D. The dots 50 of FIG. 4E are no longer able to pick up the proper amounts of ink during printing, and image quality falls.

The preferred pressure of 800 psi has been found to achieve efficient removal of unpolymerized photopolymer and avoid damage to the remaining partially polymerized photopolymer.

Returning to the apparatus illustrated in FIGS. 2 and 3, the spray nozzles 40 are supported on a water manifold 58, which supplies the water to the nozzles 40. There are preferably four tandem spray nozzles 40 aligned parallel to the direction of travel of the plates 16 between the opposed rollers 18. The manifold 58 is a tube bent into a modified U-shape and supported on a nozzle carriage 60. The upper end of the manifold 58 is connected to a water supply line 62, which is connected to a pump 64. The pump 64 supplies water at the selected water pressure of about 500 to about 1000 psi, preferably 800 psi. Compressed air is supplied from an air supply to the air spray nozzle 26 through a tube within the water manifold 58.

The spray nozzles 40 are moved transverse to the direction of travel of the plates 16, in a reciprocating fashion, by a carriage movement mechanism. The back and forth movement permits the nozzles 40 to achieve full coverage over the surfaces of two plates 16 disposed side by side on the conveyor belt 14. This approach to achieving full coverage is markedly different than that previously used in spray-type plate processors, which used an array of multiple fixed spray nozzles extending both longitudinally and transversely to the plate path to achieve partial effectiveness. Typically, about 300 nozzles were required in such processors, as compared with 4 nozzles in the present apparatus.

The high pressure spray of the present invention removes unpolymerized photopolymer material so effectively that the reciprocation of only 4 aligned nozzles 40 has been found sufficient to achieve substantially complete removal of the unpolymerized photopolymer material. Because there are only 4 nozzles 40 rather than 300 nozzles as in the art, less water is required for the washing operation, even though the pressure is higher. It has been found that the water requirement for the present approach is about 0.9-1.0 gallons per plate washed, while the prior approach of multiple low pressure nozzles required about 1-1.5 gallons per plate washed. The required electrical pumping power is also much less, being typically 1 horsepower for the pump 64 as compared with 25 horsepower for the pump in the prior approach. The reciprocating movement in the present invention is achieved with a small 1/15 horsepower motor, so that the total power requirement for the present plate processor is much less than for that of the prior processor. Even the brush-type plate processor of the art requires a 2 horsepower motor to drive the brushes.

The reciprocating movement required for the present plate processor 10 is achieved with a shuttle chain drive using a yoke with a slotted cross head, permitting the reciprocating movement to be achieved inexpensively with a motor that turns in one direction and without an expensive control system. The nozzle carriage 60 is supported by two pairs of V-notched rollers 66 that are fixed on vertical axles 68 to the carriage 60. Oppositely disposed pairs of rollers 66 are captured between two parallel square section beams 70 that extend transversely to the direction of motion of the plates as they move through the apparatus, so that the nozzle carriage 60, manifold 58, and nozzles 40 can slide freely in the transverse direction.

A carriage pull cable 72 is attached to each transverse face 74 of the carriage 60, threaded over pulleys 76 and 78 and through the drive mechanism, and affixed to structure at the other end. The drive mechanism includes an endless chain 80 mounted transversely to the direction of motion of the plates, to two sprockets 82. One of the sprockets 82 is driven by a shuttle drive motor 84 that operates at a constant selected speed.

A shuttle block 86 is supported between the lengths of chain 80 by rollers 88, that rest on a pair of transversely extending shuttle block support beams 90. Each pull cable 72 is threaded over a separate pulley 92 mounted to the shuttle block 86 with its axis of rotation parallel to the direction of movement of the plate 16, the two pulleys being mounted side by side. The end of the cable 72 is fixed to the enclosure 12 at a location 94.

The shuttle block 86 has a vertically extending slot 96 between the pulleys 92. A traveller block 98 slides in the slot 96, and a drive pin 100 extends outwardly from the block 98 to engage the chain 80. As the shuttle block moves to the left in the view of FIG. 2 (with the motor 84 turning in the counterclockwise direction), the traveller block 98 and pin 100 are at the top of the slot 96. When the shuttle block 86 reaches the leftmost sprocket 82, the pin 100 follows the chain 80 around the sprocket 82, drawing the traveller block 98 to the bottom of the slot 96. The shuttle block 86 then moves to the right until it reaches the other sprocket 82, when the reversing process is repeated.

As the shuttle block 86 moves, the length of each pull cable 72 that is between the block 86 and the transverse face 74 of the carriage 60 changes. The carriage 60 moves in the direction opposite to the travel direction of the shuttle block 86. The rate of movement of the carriage 60 is constant, except during the smooth deceleration and acceleration experienced when the pin 100 passes over the sprocket 82 at the end of its travel in each direction. There is no harsh deceleration or acceleration that could damage the mechanism.

To operate the plate processor of the present invention, the operator simply turns on the power to the pumps, heater, lamp, and motors, and places plates side by side onto the conveyor belt. The conveyor carries the plates through the washing, air knife, infrared dryer, and ultraviolet post curing stations without further attention, and the finished plates emerge from the other end of the machine.

As indicated previously, the approach of the present invention achieves important advantages in both quality of the final plate and the economics of operation. The present plate washer has been operated at a plate throughput of about 115 plates per hour, while the prior fixed manifold approach achieves 200 plates per hour and the brush approach 150 plates per hour. On the basis of power consumed per plate processed, water consumed per plate processed, apparatus size, capital cost, and maintenance required, the present apparatus is superior to the fixed manifold apparatus and the brush apparatus. The fixed manifold approach also produces large amounts of foam during operation, and this problem has never been successfully overcome. The brush approach produces a lower quality of plate processing.

Although a particular embodiment of the invention has been described in detail for purposes of illustration, various modifications may be made without departing from the spirit and scope of the invention. Accordingly, the invention is not to be limited except as by the appended claims.

I claim:

1. A process for developing photopolymer printing plates, comprising:
    furnishing a printing plate having a photosensitive polymeric coating on a surface thereof, the plate having been previously exposed to light to produce a pattern of polymerized and non-polymerized portions in the coating; and
    directing a spray of water at the coated surface under a pressure of from about 500 to about 1000 pounds per square inch to remove the non-polymerized portion of the coating from the surface.

2. The process of claim 1, including the further step of directing the spray of water at the coated surface by moving the spray of water relative to the direction of travel of the plate so that the entire surface of the plate is contacted by the spray.

3. The process of claim 1, wherein the pressure of the water is about 800 pounds per square inch.

4. The process of claim 1, including the further step of heating the plate with an infrared heater to dry the remaining water on the washed plates after the step of directing the spray of water at the coated surface.

5. The process of claim 1, including the further step of exposing the plate to ultraviolet radiation to post-cure the photosensitive polymer coating after the step of directing the spray of water at the coated surface.

* * * * *

UNITED STATES PATENT AND TRADEMARK OFFICE
CERTIFICATE OF CORRECTION

PATENT NO. : 5,223,041
DATED     : Jun. 29, 1993
INVENTOR(S) : Donald E. Cerney

It is certified that error appears in the above-indentified patent and that said Letters Patent is hereby corrected as shown below:

On the title page, under item [76], insert the following:
--[73] Assignee: Napp Systems, Inc., San Marcos, Calif.--

Signed and Sealed this

Twenty-first Day of June, 1994

Attest:

BRUCE LEHMAN

Attesting Officer    Commissioner of Patents and Trademarks